United States Patent
Zhong et al.

(10) Patent No.: US 10,186,637 B2
(45) Date of Patent: Jan. 22, 2019

(54) FLIP-CHIP LIGHT EMITTING DEVICE AND FABRICATION METHOD

(71) Applicant: XIAMEN SANAN OPTOELECTRONICS TECHNOLOGY CO., LTD., Xiamen (CN)

(72) Inventors: Zhibai Zhong, Xiamen (CN); Wen-yu Lin, Xiamen (CN); Yen-chih Chiang, Xiamen (CN); Jianming Liu, Xiamen (CN); Chia-en Lee, Xiamen (CN); Su-hui Lin, Xiamen (CN); Chen-ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/417,227

(22) Filed: Jan. 27, 2017

(65) Prior Publication Data
US 2017/0133557 A1    May 11, 2017

Related U.S. Application Data

(63) Continuation of application No. PCT/CN2015/078572, filed on May 8, 2015.

(30) Foreign Application Priority Data

Sep. 30, 2014   (CN) .......................... 2014 1 0517051

(51) Int. Cl.
*H01L 33/38* (2010.01)
*H01L 33/62* (2010.01)
(Continued)

(52) U.S. Cl.
CPC ........ *H01L 33/385* (2013.01); *H01L 33/0075* (2013.01); *H01L 33/38* (2013.01);
(Continued)

(58) Field of Classification Search
CPC . H01L 33/385; H01L 33/0075; H01L 33/641; H01L 33/62; H01L 2933/0033;
(Continued)

(56) References Cited

U.S. PATENT DOCUMENTS

2009/0224278 A1* 9/2009 Nagai ..................... H01L 24/17
                                                               257/99
2012/0138988 A1* 6/2012 Lee ......................... H01L 33/22
                                                               257/98

* cited by examiner

*Primary Examiner* — Mohammed R Alam
(74) *Attorney, Agent, or Firm* — Syncoda LLC; Feng Ma; Junjie Feng (57) ABSTRACT

A flip-chip light emitting device includes: a light-emitting epitaxial laminated layer with two opposite surfaces, in which, the first surface is a light-emitting surface; a first electrode and a second electrode that are separated from each other on the second surface of the light-emitting epitaxial laminated layer; a non-conductive substrate with two opposite surfaces and two side walls connecting those two surfaces, in which, the first surface is connected to the light-emitting epitaxial laminated layer through the first and the second electrodes; a first external electrode and a second external electrode on the second surface of the non-conductive substrate, which extend to the side walls of the non-conductive substrate till and at least cover parts of the side walls of the first and the second electrodes to form electrical connection.

12 Claims, 7 Drawing Sheets

(51) Int. Cl.
    *H01L 33/00* (2010.01)
    *H01L 33/64* (2010.01)
    *H01L 33/48* (2010.01)
(52) U.S. Cl.
    CPC ............ *H01L 33/486* (2013.01); *H01L 33/62* (2013.01); *H01L 33/641* (2013.01); *H01L 2933/0016* (2013.01); *H01L 2933/0033* (2013.01); *H01L 2933/0066* (2013.01); *H01L 2933/0075* (2013.01)
(58) Field of Classification Search
    CPC ..... H01L 2933/0075; H01L 2933/0066; H01L 2933/0016; H01L 33/387
    See application file for complete search history.

FLIP-CHIP LIGHT EMITTING DEVICE AND FABRICATION METHOD

CROSS-REFERENCE TO RELATED APPLICATIONS

The present application is a continuation of, and claims priority to, PCT/CN2015/078572 filed on May 8, 2015, which claims priority to Chinese Patent Application No. 201410517051.1 filed on Sep. 30, 2014. The disclosures of these applications are hereby incorporated by reference in their entirety.

BACKGROUND

With advantages of high efficiency, long service life, all solid-state, electro luminescence, small size and environmental friendliness, light emitting diodes (LEDs) are known as the fourth generation of lighting sources or the energy-saving lighting sources and are widely applied in indication, display, decoration, backlight, general lighting, urban night lights, etc.

For LED chips with sapphire and AlN non-conductive substrates, thermal conductivity of the substrate is low, resulting in high temperature of the PN junction in lateral LEDs. To improve heat dissipation, a flip-chip structure with higher light emitting efficiency is proposed.

SUMMARY

The present disclosure relates to a flip-chip light emitting device and the fabrication method thereof.

According to the first aspect of the present disclosure, a flip-chip light emitting device is provided, comprising: a light-emitting epitaxial laminated layer with two opposite surfaces, in which, the first surface is a light-emitting surface; a first electrode and a second electrode that are separated from each other on the second surface of the light-emitting epitaxial laminated layer; a non-conductive substrate with two opposite surfaces and two side walls connecting those two surfaces, in which, the first surface is connected to the light-emitting epitaxial laminated layer through the first and the second electrodes; and a first external electrode and a second external electrode on the second surface of the non-conductive substrate, which extend to the side walls of the non-conductive substrate till and at least cover parts of the side walls of the first and the second electrodes to form electrical connection.

Preferably, the light-emitting epitaxial laminated layer has a thinned single crystal substrate. In a preferred embodiment of the present disclosure, the growth substrate is an ultra-thin AlN and forms a roughening structure on the light-emitting surface, wherein, the substrate is 10 µm-100 µm thick, and the light-emitting wavelength of the light-emitting epitaxial laminated layer is 200 nm-360 nm.

Preferably, the edges of the first and the second electrodes extend beyond the light-emitting epitaxial laminated layer edge. In a preferred embodiment of the present disclosure, the extension distance equals to or is larger than 30 µm to avoid short circuit of the side walls of the light-emitting epitaxial laminated layer during fabrication of the first and the second external electrodes.

Preferably, the first and the second electrodes are of equal height and the space between them is 40-150 µm.

Preferably, a plating seed layer is formed between the non-conductive substrate and the first and the second external electrodes.

Preferably, the first and the second external electrodes are electroplated on the plating seed layer.

According to the second aspect of the present disclosure, a fabrication method for flip-chip light emitting devices is provided, comprising: 1) providing a light-emitting epitaxial wafer with two opposite surfaces composed of a growth substrate and a light-emitting epitaxial laminated layer, wherein, one side surface of the growth substrate is the first surface; 2) determining the size of the light emitting device, and dividing the light-emitting epitaxial laminated layer into a series of light-emitting epitaxial units, and fabricating a first electrode and a second electrode that are electrically isolated on each light-emitting epitaxial unit; 3) providing a non-conductive substrate with two opposite surfaces, and connecting the light-emitting epitaxial wafer to the first surface of the non-conductive substrate in a flip-chip way; 4) cutting the non-conductive substrate apart to expose the sides of the first and the second electrodes of each light-emitting epitaxial unit; 5) fabricating a first external electrode and a second external electrode on the second surface of the non-conductive substrate, which extend to the side walls of the non-conductive substrate till and at least cover parts of the side walls of the first and the second electrodes from the second surface of the non-conductive substrate to form electrical connection; and 6) singulating the light-emitting epitaxial wafer to form a flip-chip light emitting device.

Preferably, in step 1), the growth substrate is a single crystal substrate.

Preferably, the edges of the first and the second electrodes formed in step 2) extend beyond the light-emitting epitaxial laminated layer edge.

Preferably, in step 3), firstly form a metal bonding layer on the first surface of the non-conductive substrate and bond the light-emitting epitaxial wafer on the non-conductive substrate in a flip-chip way.

Preferably, in step 4), the growth substrate is thinned before cutting.

Preferably, in step 5), form a plating seed layer between the second surface and the side walls of the non-conductive substrate and then electroplate a first external electrode and a second external electrode on the plating seed layer.

In another aspect, a light-emitting system is provided including a plurality of the light-emitting devices described above. The light-emitting system can be used for displays, lighting, signage, etc.

BRIEF DESCRIPTION OF THE DRAWINGS

The accompanying drawings, which are included to provide a further understanding of the invention and constitute a part of this specification, together with the embodiments, are therefore to be considered in all respects as illustrative and not restrictive. In addition, the drawings are merely illustrative, which are not drawn to scale.

DETAILED DESCRIPTION

Further detailed description will be made to the invention with the following embodiments.

Figure 1:
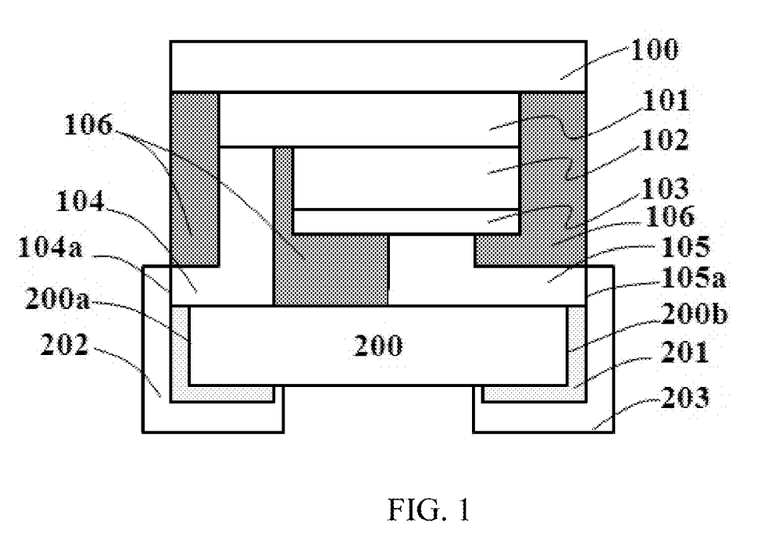
FIG. 1 is a side sectional view of a flip-chip light emitting device according to some embodiments.

FIG. 1 is a cross-section structure diagram of a light emitting device according to Embodiment 1. The light emitting device comprises a transparent growth substrate 100, a light-emitting epitaxial laminated layer composed of a first semiconductor layer 101 and a second semiconductor layer 102, a first electrode 104 and a second electrode 105 connected to the first semiconductor layer 101 and the second semiconductor layer 102, a non-conductive substrate 200 connected to the light-emitting epitaxial laminated layer through the first and the second electrodes 104 and 105, a first epitaxial electrode 202 and a second epitaxial electrode 203 on the lower surface of the non-conductive substrate that extend to the side walls 200a and 200b of the non-conductive substrate till the side walls 104a and 105a of the first and the second electrodes to form a wrapped structure, Wherein, the transparent growth substrate 100 is a thinned single-crystal substrate. In this embodiment, the growth substrate is an ultra AlN substrate and can form a 10 μm-100 μm thick roughening structure on the light-emitting surface. A PN junction is formed between the first semiconductor layer 101 and the second semiconductor layer 102. When the first semiconductor layer 101 is a p-type semiconductor, the second semiconductor layer 102 can be an n-type semiconductor in different electrical property and vice versa. As a preferred embodiment, a multiple-quantum well structure can be formed between the first semiconductor layer 101 and the second semiconductor layer as an active layer, which can be a neutral-type, a p-type or an n-type semiconductor. When the applied current passes through the light-emitting epitaxial laminated layer, light is emitted. When the light-emitting epitaxial laminated layer is made of nitride-based material, ultraviolet, blue or green light will be emitted; when made of AlInGaP-based material, red, orange or yellow light in amber color will be emitted. An reflective layer 103 made of Ni/Al/Ti/Pt is on the second semiconductor layer surface, for upwards reflecting the light from the upper light-emitting epitaxial laminated layer and emitting from the light-emitting surface.

The first electrode 104 is on the surface of the first semiconductor layer 101, and the second electrode 105 is on the surface of the reflective layer 103; the first and the second electrodes are about 0.5 μm-5 μm thick and space between them is 40 μm-150 μm; their ends far from the light-emitting epitaxial laminated layer are on a same plane (i.e., the first and the second electrodes 104 and 105 are of equal height), and extend towards and beyond two sides of the light-emitting epitaxial laminated layer respectively by 30 μm or above. The first and the second electrodes 104 and 105 are made of any alloy comprising Cr, Ni, Co, Cu, Sn and Au; in preferred embodiments, a multi-structure like Cr/Pt/Au is adopted, and the top layer metal is Au.

An insulating layer 106 is filled in the gap between the first electrode 104 and the second electrode 105 and the gap between the first and the second electrodes 104 and 105 and the light-emitting epitaxial laminated layer to form a flat surface at the lower portion of the light-emitting epitaxial laminated layer. The insulating layer 106, on the one hand, guarantees electric isolation between the first and the second electrodes 104 and 105, and on the other hand, protects the light-emitting epitaxial laminated layer by forming a complete physical structure on the lower surface of the growth substrate 100. The insulating layer 106 can be made of SiO2, SOG, resin or photoresist.

A non-conductive substrate 200 is connected to the light-emitting epitaxial laminated layer through the first and the second electrodes 104 and 105, which is preferred to be made of heat-dissipating materials. In a preferred embodiment, a patterned metal bonding layer (not shown) is formed between the non-conductive substrate and the first and the second electrodes, which corresponds to and with area not more than 60% of the first and the second electrodes 104 and 105.

A first external electrode 202 and a second external electrode 203 are on the lower surface of the non-conductive substrate 200 and extend to the side walls 200a and 200b of the non-conductive substrate 200 till and at least cover parts of the side walls 104a and 105a of the first and the second electrodes 104 and 105 to wrap side walls 200a and 200b of the non-conductive substrate respectively and to form electrical connection with the first electrode 104 and the second electrode 105. The first and the second external electrodes are preferred to be 20 μm-200 μm thick. In a preferred embodiment, a plating seed layer 201, preferably made of Ni/Pt/Au, is formed between the non-conductive substrate 200 and the first and the second external electrodes 202 and 203 that are electroplated on this plating seed layer 201.

FIGS. 2-12 illustrate the fabrication method for the flip-chip light emitting device as shown in FIG. 1.

Figure 2:
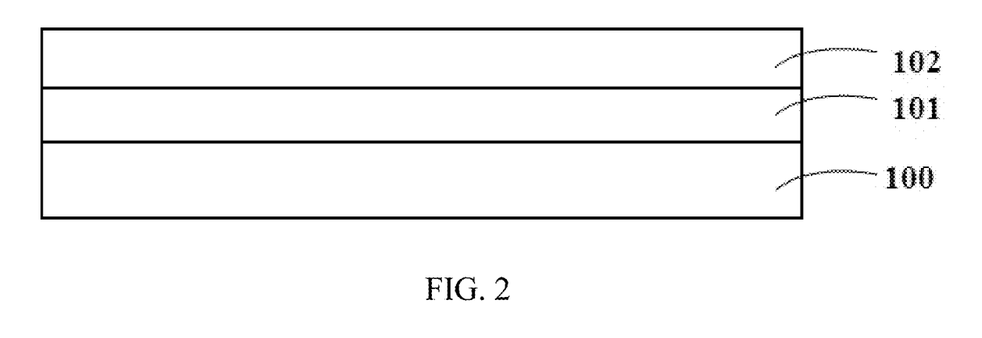
FIG. 2 illustrates a first step of fabricating a flip-chip deep ultraviolet light emitting diode according to some embodiments.

As shown in FIG. 2, provide a growth substrate 100 and form a first semiconductor layer 101 and a second semiconductor layer 102 on the growth substrate 100 through epitaxial growth to form a light-emitting epitaxial wafer.

Figure 3:
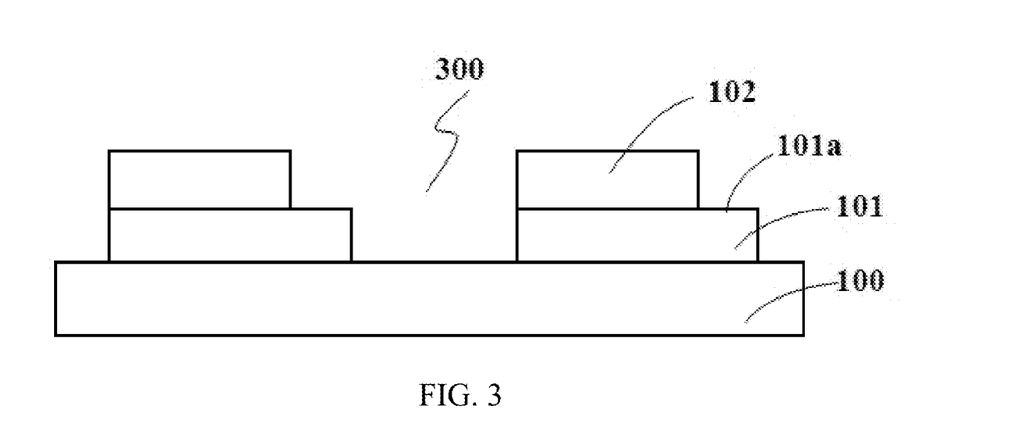
FIG. 3 illustrates a second step of fabricating a flip-chip light emitting diode according to some embodiments.

As shown in FIG. 3, determine the size of the light emitting device; remove parts of the first semiconductor layer 101 and the second semiconductor layer 102 to form a cutting channel 300 through etching, which divides this light-emitting epitaxial laminated layer into a series of light-emitting epitaxial units; etch part of the second semiconductor layer 202 of each light-emitting epitaxial unit to expose the surface 101a of the first semiconductor layer for electrode fabrication.

Figure 4:
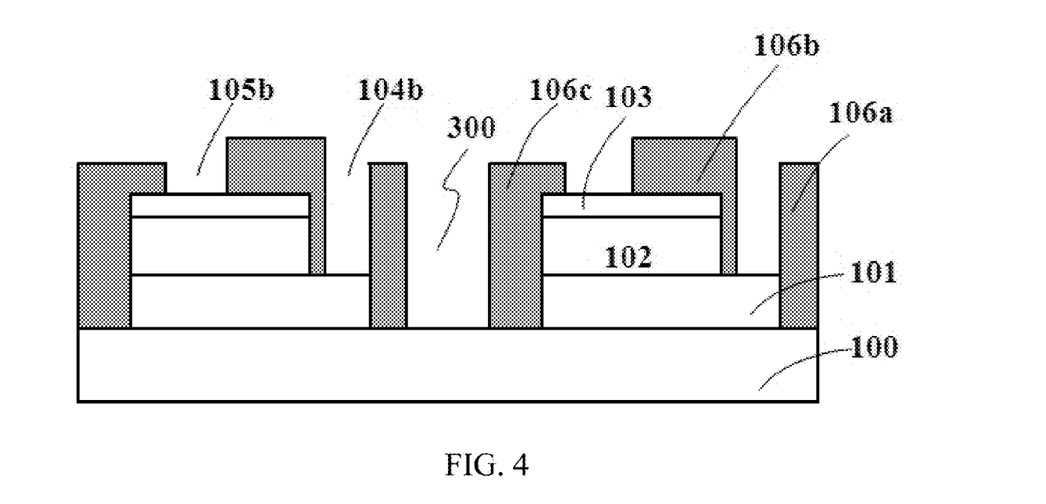
FIG. 4 illustrates a third step of fabricating a flip-chip light emitting diode according to some embodiments.

As shown in FIG. 4, fabricate an electrode reflective layer 103 on the second semiconductor layer 102 of each light-emitting epitaxial unit, and determine a first electrode region 104b and a second electrode region 105b on each light-emitting epitaxial unit; cover insulating layers 106a, 106b and 106c at side walls of each light-emitting epitaxial unit and other areas apart from the first and the second electrode regions.

Figure 5:
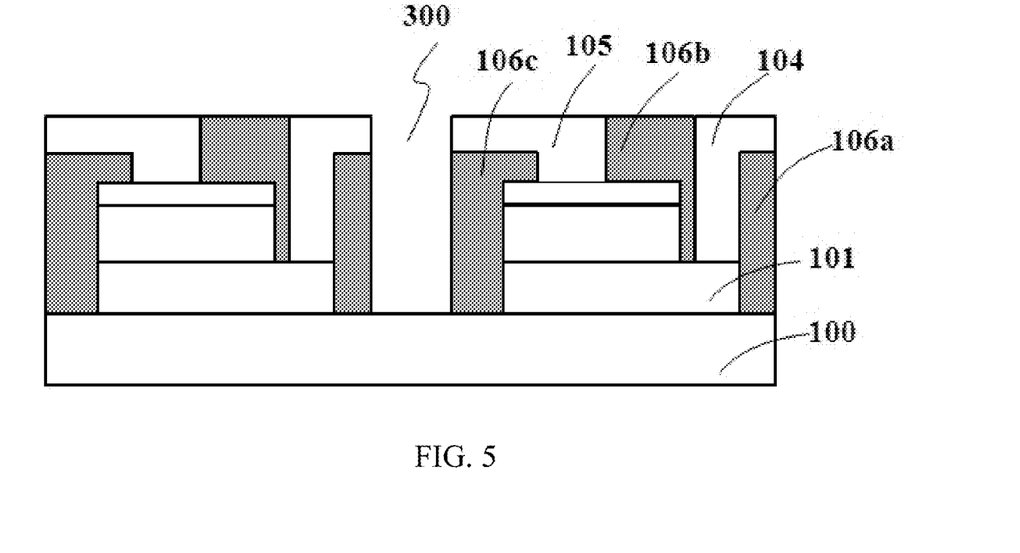
FIG. 5 illustrates a fourth step of fabricating a flip-chip light emitting diode according to some embodiments.

As shown in FIG. 5, fabricate a first electrode 104 and a second electrode 105 on the first and the second electrode regions 104b and 105b of each light-emitting epitaxial unit, wherein, the fist electrode 104 is on the first semiconductor layer 101, and the end far from the light-emitting epitaxial laminated layer extends towards the outer side of the light-emitting epitaxial laminated layer to cover the surface of the insulating layer 106a, and the edge extends beyond the light-emitting epitaxial laminated layer edge; and the second electrode 105 is on the surface of the reflective layer 103, and the end far from the light-emitting epitaxial laminated layer extends towards the outer side of the light-emitting epitaxial laminated layer to cover the surface of the insulating layer 106c, and the edge extends beyond the light-emitting epitaxial laminated layer edge; and the first and the second electrodes 104 and 105 and the insulating layer 106b constitute a complete plane.

Figure 6:
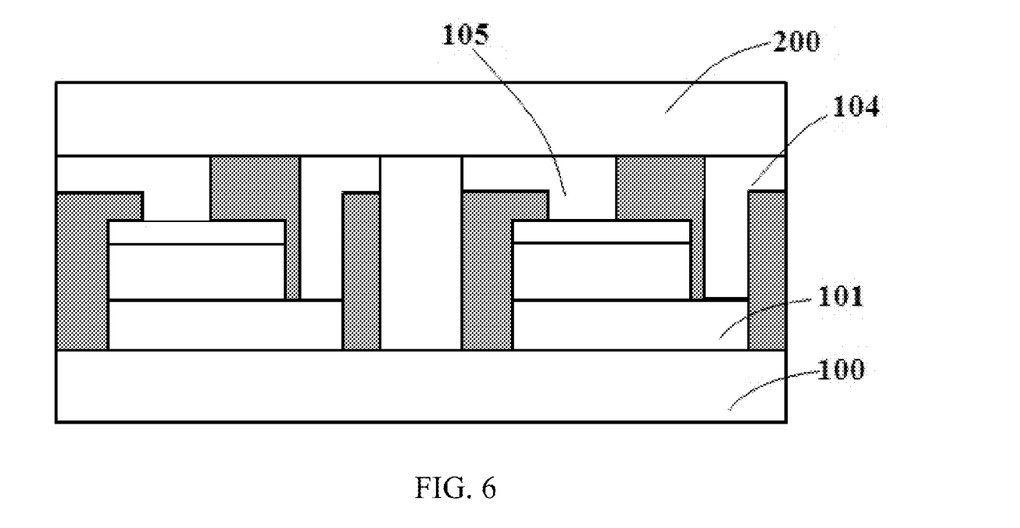
FIG. 6 illustrates a fifth step of fabricating a flip-chip light emitting diode according to some embodiments.

As shown in FIG. 6, provide a non-conductive substrate 200 and bond the light-emitting epitaxial wafer after the aforesaid processing on the non-conductive substrate 200 in a flip-chip way. In a preferred embodiment, a patterned metal bonding layer (not shown) is preset on the non-conductive substrate 200, which corresponds to and with area not more than 60% of the first and the second electrodes 104 and 105. In another preferred embodiment, the growth substrate 100 can be further thinned to 20 μm-200 μm and roughened.

Figure 7:
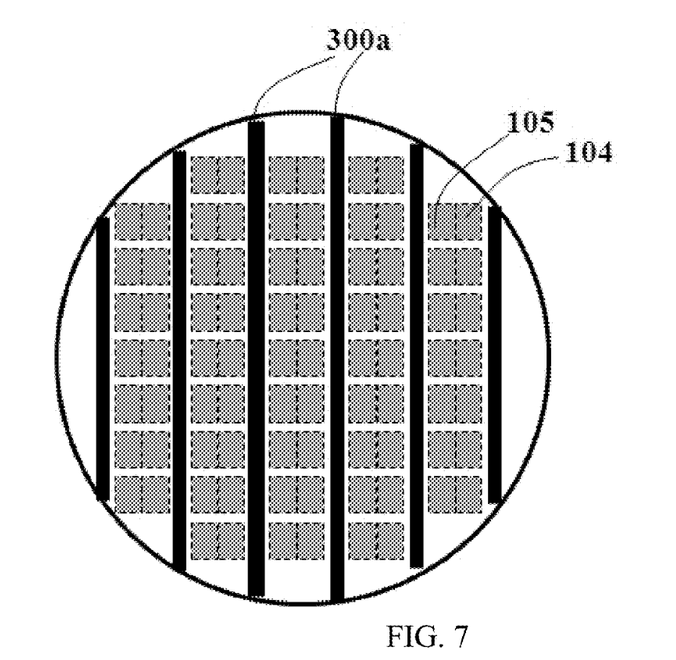
FIG. 7 illustrates a sixth step of fabricating a flip-chip light emitting diode according to some embodiments.
Figure 8:
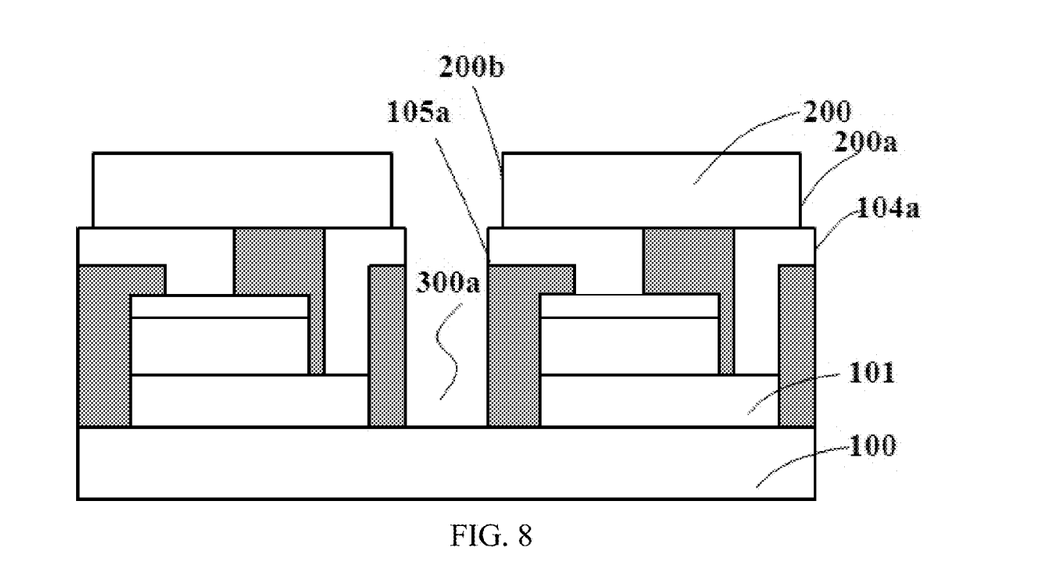
FIG. 8 illustrates a seventh step of fabricating a flip-chip light emitting diode according to some embodiments.

As shown in FIGS. 7 and 8, a cutting channel 300a along the first direction cuts the non-conductive substrate 200 apart to expose the sides 104a and 105a of the first and the second electrodes of each light-emitting epitaxial unit. In this step, the non-conductive substrate 200 is divided into a series of modules, each being connected to a row of light-emitting epitaxial units respectively. In one embodiment, the first and the second electrodes 104 and 105 of each light-emitting epitaxial unit are distributed bilaterally, wherein, the first electrode 104 is at left of the cutting channel 300a at the first direction and the second electrode 105 is at right. In a preferred embodiment, the cutting channel 300a can be in regular trapezoid. After cutting, distance between light-emitting epitaxial laminated layer edges is preferred to be larger than 40 μm.

Figure 9:
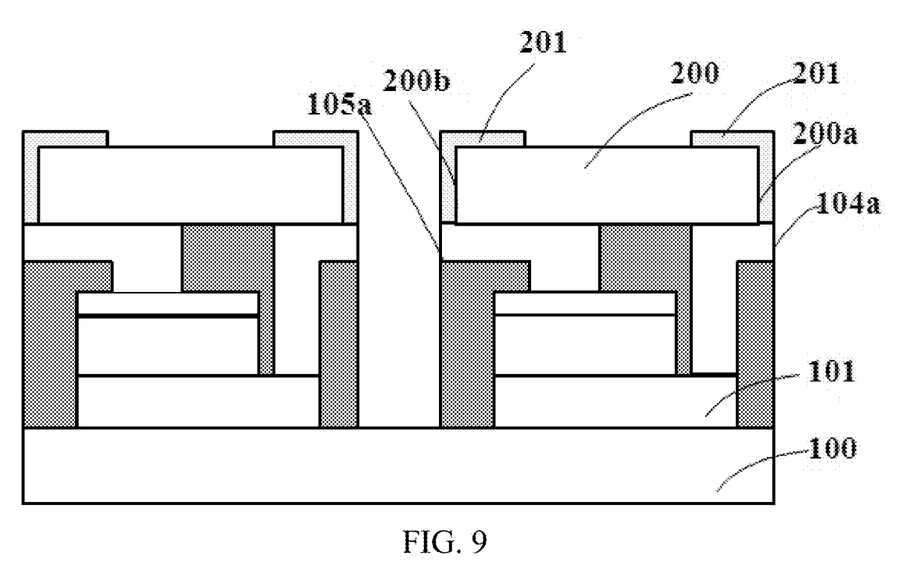
FIG. 9 illustrates an eighth step of fabricating a flip-chip light emitting diode according to some embodiments.

As shown in FIG. 9, a plating seed layer 201 is formed at the side walls 200a and 200b on the bottom of each non-conductive substrate module close to the cutting channel 300a at the first direction. The plating seed layers 201 are formed at two ends in each non-conductive substrate module close to the cutting channel 300a at the first direction, which are separated from each other and correspond to the first and the second electrodes of the light-emitting epitaxial unit.

Figure 10:
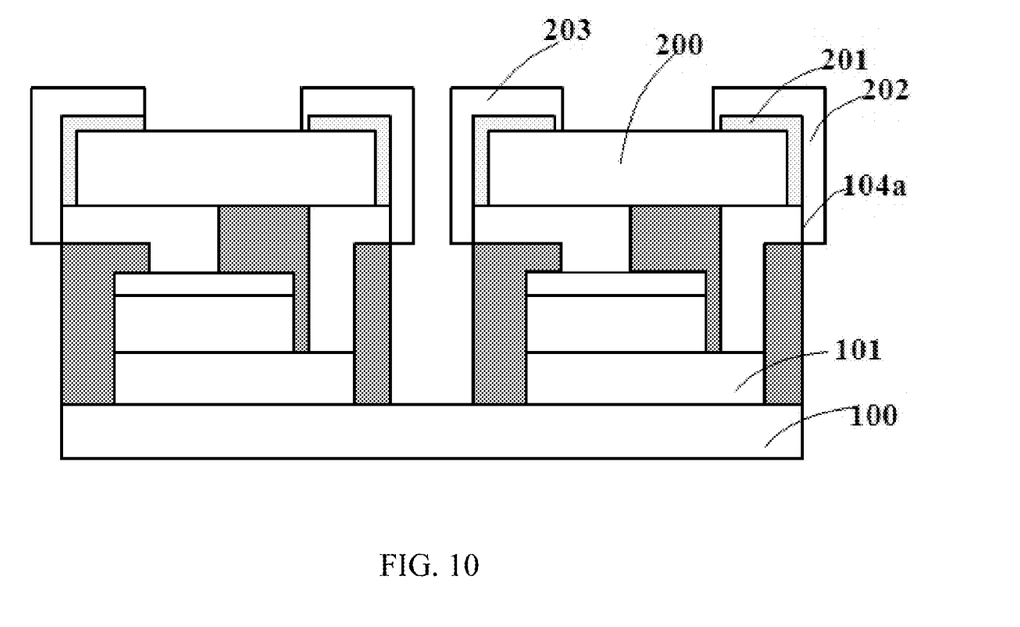
FIG. 10 illustrates a ninth step of fabricating a flip-chip light emitting diode according to some embodiments.

As shown in FIG. 10, electroplate a first external electrode 202 and a second external electrode 203 on the plating seed layer 201 through metal with good ductility like Cu, Au and Pt, and ensure that the middle of the cutting channel 300a at the first direction is separated, and the first and the second external electrodes are 20 μm-200 μm thick.

Figure 11:
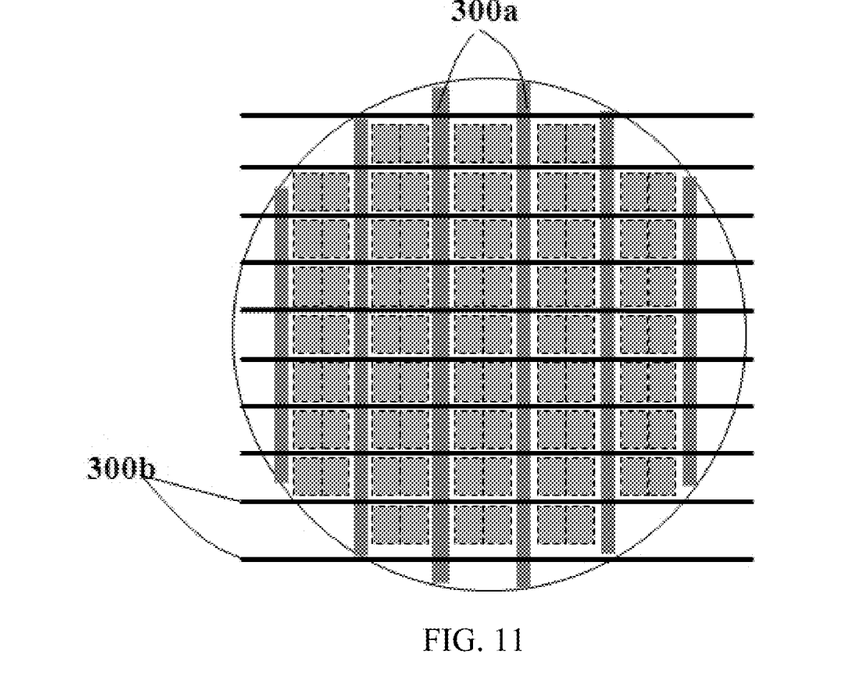
FIG. 11 illustrates a tenth step of fabricating a flip-chip light emitting diode according to some embodiments.

As shown in FIG. 11, cut the non-conductive substrate apart along the cutting channel 300b at the second direction.

Figure 12:
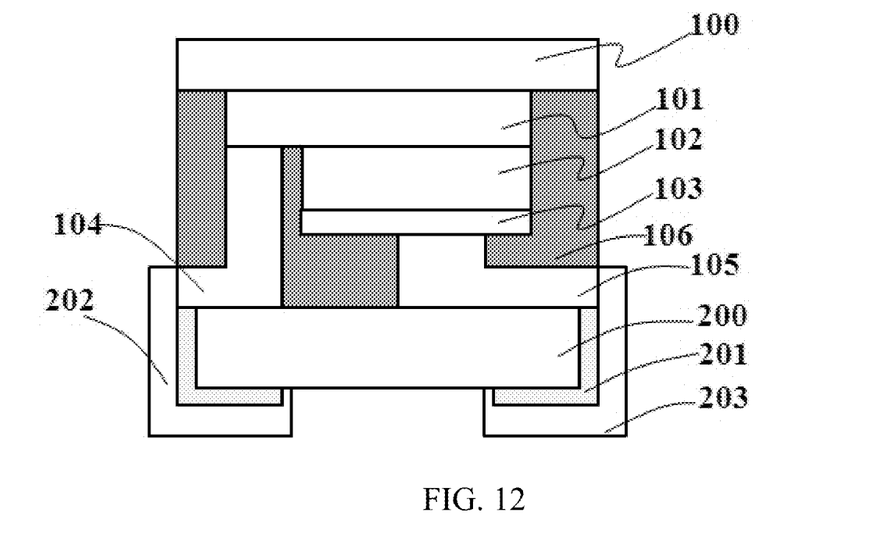
FIG. 12 illustrates an eleventh step of fabricating a flip-chip light emitting diode according to some embodiments.

As shown in FIG. 12, singulate the light-emitting epitaxial wafer after the aforesaid processing to form a flip-chip light emitting device.

Compared with the flip-chip light emitting devices with singulation bonding in prior art, full wafer processing is made possible in the fabrication method disclosed in the present invention, which requires no precise chip alignment and improves fabrication efficiency of flip chips. In addition, metal with good ductility bonds the submount to the chip to form a surface mounted and flip-chip light emitting device and greatly lowers package costs. During fabrication, the external electrodes are electroplated at the parallel direction with the first cutting direction to avoid risks like short circuit and electric leakage during anode and cathode package and bonding of chips.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A flip-chip light emitting device, comprising: a light-emitting epitaxial laminated layer with a first and a second opposing surfaces, wherein the first surface is a light-emitting surface; a first electrode and a second electrode separated from each other disposed over and directly connecting the second surface of the light-emitting epitaxial laminated layer; a non-conductive substrate with a first and a second opposing substrate surfaces and two side surfaces connecting the first and second substrate surfaces, wherein the first substrate surface is connected to the light-emitting epitaxial laminated layer through the first and the second electrodes; and a first external electrode and a second external electrode over the second substrate surface extending to the two side surfaces of the non-conductive substrate and at least covering portions of side walls of the first and the second electrodes to form electrical connection, wherein: a thinned single crystal substrate on the light-emitting epitaxial laminated layer and edges of the thinned single crystal substrate extend beyond edges of the light-emitting epitaxial laminated layer.

2. The flip-chip light emitting device of claim 1, wherein: edges of the first and the second electrodes extend beyond the edges of the light-emitting epitaxial laminated layer.

3. The flip-chip light emitting device of claim 1, wherein: edges of the first and the second electrodes extend beyond the edges of the light-emitting epitaxial laminated layer by 30 μm or above, to thereby avoid short circuit of side walls of the light-emitting epitaxial laminated layer during fabrication of the first and the second external electrodes.

4. The flip-chip light emitting device of claim 1, wherein: a space between the first and the second electrodes is 40 μm-150 μm.

5. The flip-chip light emitting device of claim 1, wherein: the first and the second electrodes have an equal height.

6. The flip-chip light emitting device of claim 1, wherein: a plating seed layer is formed between the non-conductive substrate and the first and the second external electrodes and extends from the second substrate surface to the two side surfaces of the non-conductive substrate.

7. The flip-chip light emitting device of claim 6, wherein: the first and the second external electrodes are electroplated over the plating seed layer.

8. A light-emitting system comprising a plurality of light-emitting devices, each light-emitting device comprising: a light-emitting epitaxial laminated layer with a first and a second opposing surfaces, wherein the first surface is a light-emitting surface; a first electrode and a second electrode separated from each other disposed over and directly connecting the second surface of the light-emitting epitaxial laminated layer; a non-conductive substrate with a first and a second opposing substrate surfaces and two side surfaces connecting the first and second substrate surfaces, wherein the first substrate surface is connected to the light-emitting epitaxial laminated layer through the first and the second electrodes; and a first external electrode and a second external electrode over the second substrate surface extending to the two side surfaces of the non-conductive substrate and at least covering portions of side walls of the first and the second electrodes to form electrical connection, wherein: a thinned single crystal substrate on the light-emitting epitaxial laminated layer and edges of the thinned single crystal substrate extend beyond edges of the light-emitting epitaxial laminated layer.

9. The light-emitting system of claim 8, wherein: edges of the first and the second electrodes extend beyond the edges of the light-emitting epitaxial laminated layer.

10. The light-emitting system of claim 8, wherein: edges of the first and the second electrodes extend beyond the edges of the light-emitting epitaxial laminated layer by 30 µm or above, to thereby avoid short circuit of side walls of the light-emitting epitaxial laminated layer during fabrication of the first and the second external electrodes.

11. The light-emitting system of claim 8, wherein: a space between the first and the second electrodes is 40 µm-150 µm.

12. The light-emitting system of claim 11, wherein: the first and the second electrodes have an equal height; a plating seed layer is formed between the non-conductive substrate and the first and the second external electrodes and extends from the second substrate surface to the two side surfaces of the non-conductive substrate; and the first and the second external electrodes are electroplated over the plating seed layer.

\* \* \* \* \*